United States Patent
Rao et al.

(10) Patent No.: US 7,929,334 B2
(45) Date of Patent: Apr. 19, 2011

(54) IN-SITU RESISTANCE MEASUREMENT FOR MAGNETIC RANDOM ACCESS MEMORY (MRAM)

(75) Inventors: Hari Rao, San Diego, CA (US); Sei Seung Yoon, San Diego, CA (US); Xiaochun Zhu, San Diego, CA (US); Mohamed Abu-Rahma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 12/361,588

(22) Filed: Jan. 29, 2009

(65) Prior Publication Data
US 2010/0188894 A1   Jul. 29, 2010

(51) Int. Cl.
*G11C 11/00* (2006.01)
*G11C 11/14* (2006.01)
*G11C 7/00* (2006.01)
*G11C 7/02* (2006.01)

(52) U.S. Cl. ......... 365/158; 365/171; 365/201; 365/209
(58) Field of Classification Search .................. 365/158
See application file for complete search history.

(56) References Cited

U.S. PATENT DOCUMENTS

| | | | |
|---|---|---|---|
| 6,317,376 B1 * | 11/2001 | Tran et al. | 365/210.12 |
| 6,697,294 B1 * | 2/2004 | Qi et al. | 365/210.15 |
| 6,721,203 B1 * | 4/2004 | Qi et al. | 365/173 |
| 6,738,285 B2 * | 5/2004 | Tanizaki et al. | 365/158 |
| 7,187,576 B2 * | 3/2007 | Braun et al. | 365/158 |
| 7,577,020 B2 * | 8/2009 | Chung et al. | 365/158 |
| 2008/0007992 A1 | 1/2008 | Wang | |
| 2009/0067233 A1 * | 3/2009 | Park et al. | 365/173 |
| 2010/0073992 A1 * | 3/2010 | Ueda | 365/148 |
| 2010/0110761 A1 * | 5/2010 | Chen et al. | 365/148 |

FOREIGN PATENT DOCUMENTS

| | | |
|---|---|---|
| EP | 1496518 | 1/2005 |
| EP | 1512982 | 3/2005 |
| EP | 1564750 | 8/2005 |
| EP | 1788576 | 5/2007 |
| WO | 2008109772 | 9/2008 |

OTHER PUBLICATIONS

International Search Report-PCT/US2010/022476, International Search Authority European Patent Office Jul. 15, 2010.
Written Opinion-PCT/US2010/022476, International Search Authority-European Patent Office Jul. 15, 2010.

* cited by examiner

*Primary Examiner* — Son L Mai
(74) *Attorney, Agent, or Firm* — Sam Talpalatsky; Nicholas J. Pauley; Jonathan T. Velasco

(57) ABSTRACT

A method of measuring resistance of a magnetic tunnel junction (MTJ) of an MRAM memory cell includes applying a voltage of a selected level to a memory cell comprising an MTJ in series with a memory cell transistor in a conducting state. A current through the memory cell is determined. A variable voltage is applied to a replica cell not having an MTJ and comprising a replica cell transistor in a conducting state. A value of the variable voltage is determined, wherein a resulting current through the replica cell is substantially the same as the current through the memory cell. The MTJ resistance is computed by taking the difference of the memory cell voltage and the determined variable replica cell voltage and dividing the result by the determined memory cell current.

20 Claims, 5 Drawing Sheets

IN-SITU RESISTANCE MEASUREMENT FOR MAGNETIC RANDOM ACCESS MEMORY (MRAM)

TECHNICAL FIELD

This disclosure relates to integrated electronic circuitry and, in particular, to in situ measurement of integrated circuitry memory elements.

BACKGROUND

In magnetoresistive RAM (MRAM) data is stored as magnetic polarization in elements called magnetic tunnel junctions (MTJs). The resistance depends on the relative polarization of two layers in the MTJ. One layer is permanent ("fixed") while the other ("free") layer will change to match that of a sufficiently strong external field. By measuring the resistance, the free layer polarization can be determined. A memory device may be built from a grid of such "cells" incorporating MTJs.

Alternatively, spin-transfer-torque (STT) MRAM uses spin-aligned ("polarized") electrons of sufficient critical current density to directly torque and "write" the polarization to the free layer, where the polarization direction and junction resistance depend on the direction of electron flow. A sub-critical current density can be used to measure the resistance. This write current further decreases as the memory cell size scales down, which is a critical benefit as the Si technology continues to scale to higher device pitch density.

A memory state is determined by whether the free and fixed layer polarizations are parallel or anti-parallel. In the parallel state ("0-State"), the tunneling resistance across the thin insulating layer is relatively "low." In the anti-parallel state, the tunneling resistance across the thin insulating layer is relatively "high." Measuring this magnetoresistance determines the memory state stored in the MTJ cell.

A metric for characterizing the two resistance values is called the magnetization ratio (MR), defined as the difference between the MTJ anti-parallel resistance ($R_{ap}$) and the MTJ parallel resistance ($R_p$), divided by the MTJ parallel resistance ($R_p$), i.e., ($R_{ap}-R_p$)/$R_p$. It is preferable that the MR be as large as possible, i.e., that the resistance values of the two states be as far apart as possible, to ensure the reliability of correctly reading the memory state of an MTJ cell.

Measuring the memory state may be accomplished, for example, as follows: An MRAM cell may conventionally include an MTJ and a transistor in series between a bit line and a source line. The bit line and source line are set at a potential difference. When the transistor gate is set on (e.g., "high"), current can flow through the MTJ. The current is defined by the net potential difference and the series sum of bit line resistance, MTJ resistance, transistor on state resistance and source line resistance. The MTJ resistance can have one of two values: "low" for the parallel 0-State, or "high" for the anti-parallel 1-State. By measuring the voltage drop across the MTJ and the current passing through the MTJ cell, the resistance may be computed. A reference voltage, e.g., between the MTJ-transistor junction and the source line, may be compared to the voltage measured with the MTJ in either of two states. Setting the reference voltage to a value intermediate between the two measured voltages may be used in a comparator logic gate to distinguish the two states.

Due to variations in processing conditions that may normally occur in the course of device fabrication, and even variations across the extent of a single chip containing many such MTJ cells in a memory array (due, for example, to lithography uniformity), variations in the value of the magnetoresistance may result. This becomes increasingly important when device structures scale to dimensions on the order of tens of nanometers or less, and the process variations are on the order of nanometers. That is, when the fractional change in device dimensions become significant relative to the device size, the possibility exists that process variations may result in the magnetoresistance of some MTJ cells in the low 0-State becoming close to or overlapping with the magnetoresistance of some MTJ cells in the high 1-State. Since the resistance value is conventionally determined by measuring a voltage drop across the MTJ cell and comparing it to the reference voltage, errors in reading the memory state of the MTJ cell may occur.

In a large memory array of MTJ cells, the number of memory read errors may become significant due to process variation and temperature (PVT). In conjunction with automated test equipment (ATE), 100% testing of all memory elements is possible.

Because the total of all resistances occurring from all sources apart from the MTJ, i.e., "parasitic" resistance, may be comparable to the MTJ resistance, the total measurable difference in resistance between the two MTJ states may be a significant fraction (e.g., 25%-75%) of the total resistance. A larger parasitic resistance dilutes the change in voltage measured between the two resistance states of the MTJ, as described above, which may limit the margins for setting a resistance reference level for distinguishing which state the MTJ is in, i.e., whether the resistance is lower than the reference (an average of $R_p$ and $R_{ap}$), or higher than the reference.

Moreover, ATE, cables to interface the ATE and the memory chip, and on-chip interconnects may introduce additional parasitic resistances and reactive impedances. Such parasitics may be significant compared to the impedance of a nanoscale MTJ MRAM device and this may limit the accuracy and speed of testing.

There is a need, therefore, to be able to characterize the statistical variation of magnetoresistance in both states of MTJ cells in a memory array, both as a means of characterizing process stability, and in determining parallel resistance and anti-parallel resistance reference levels for reading memory states, that can cancel out or compensate for parasitic effects.

SUMMARY

A method and system are disclosed for measuring MTJ resistance in situ on an integrated circuit containing an array of MRAM memory. Each MTJ cell in the MRAM array is compared to a replica cell in proximity to the MTJ cell. The replica cell includes the same parasitic components, but not an MTJ. This enables cancellation of parasitic impedances common to both cells, and determination of the MTJ resistance, using a current mirroring scheme.

A method of measuring resistance of a magnetic tunnel junction (MTJ) of a magnetic random access memory (MRAM) cell includes applying a voltage of a selected level to a memory cell comprising an MTJ in series with a memory cell transistor in a conducting state, determining an amount of current passing through the memory cell, applying a variable voltage to a replica cell not having an MTJ and comprising a replica cell transistor in a conducting state, determining a value of the variable voltage wherein an amount of current passing through the replica cell is substantially the same as the amount of current passing through the memory cell, and computing the MTJ resistance by taking the difference of the memory cell voltage and the determined variable replica cell voltage and dividing the result by the determined memory cell current.

A method of measuring resistance of a magnetic tunnel junction (MTJ) in a magnetic random access memory (MRAM) array of MTJ memory cells includes dividing the MRAM into addressable segments, comparing each MTJ cell in one of the addressable segments to a corresponding replica cell in an associated group of replica cells, and determining a resistance of each MTJ cell on the basis of the comparing.

An array structure for magnetic tunnel junction (MTJ) magnetic random access memory (MRAM) includes modules and banks within each module. Each bank includes MTJ memory bit slices and a replica bit slice. Multiple MTJ memory cells are provided within each MTJ memory bit slice, and multiple replica cells are provided within each replica bit slice. A number of replica bit cells is equal to a largest number of MTJ memory cells in any of the MTJ bit slices of a same bank.

The foregoing has outlined rather broadly the features and technical advantages of the present disclosure in order that the detailed description that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the FIGS. is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawing.

DETAILED DESCRIPTION

A method and system are disclosed for measuring MTJ resistance in situ on an integrated circuit containing an array of MRAM memory.

Figure 1:
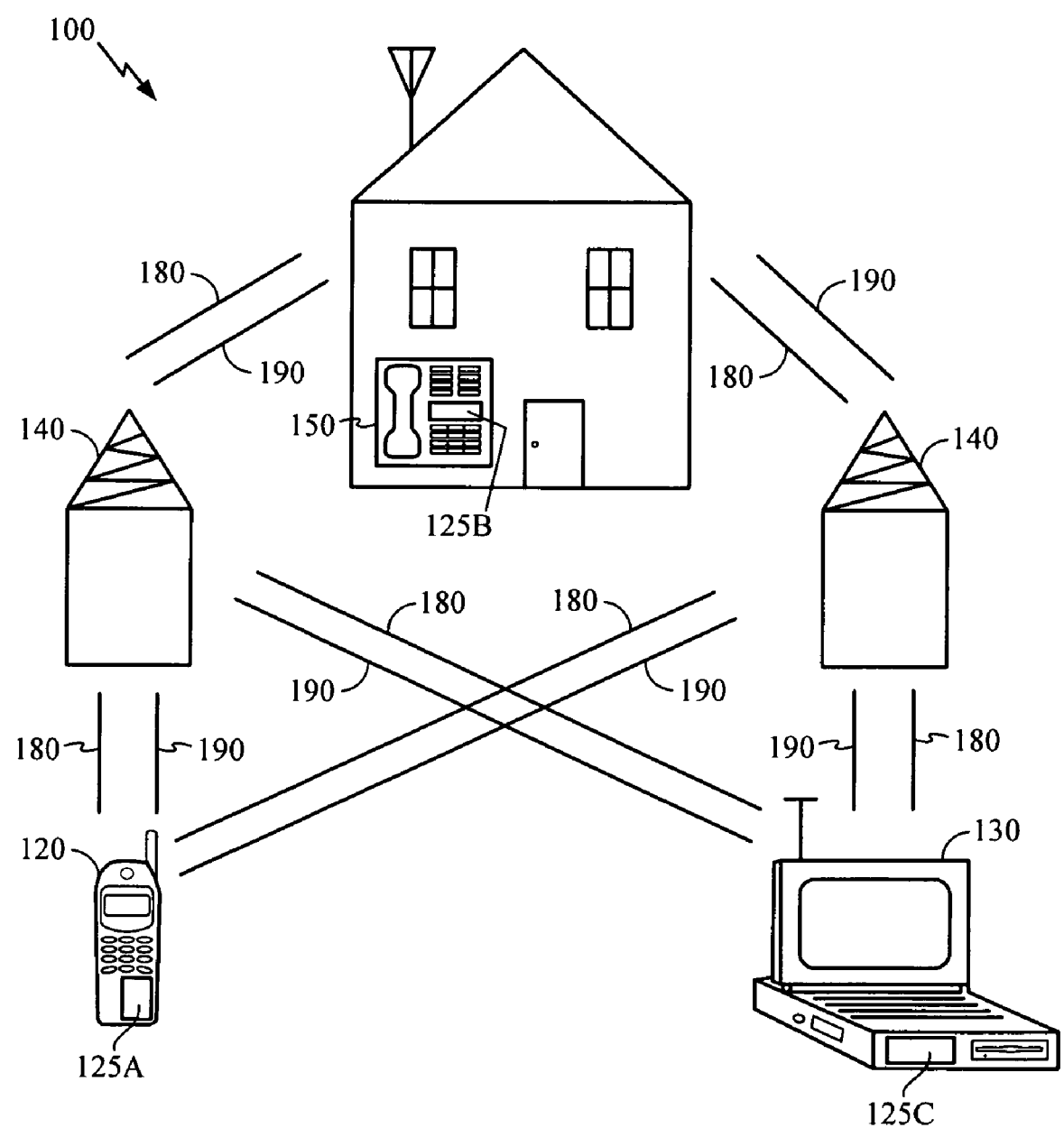
FIG. 1 is a block diagram showing an exemplary wireless communication system in which an embodiment of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include MRAM and/or STT MRAM memory devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. Embodiments of the disclosure may be suitably employed in any device which includes a memory.

Figure 2:
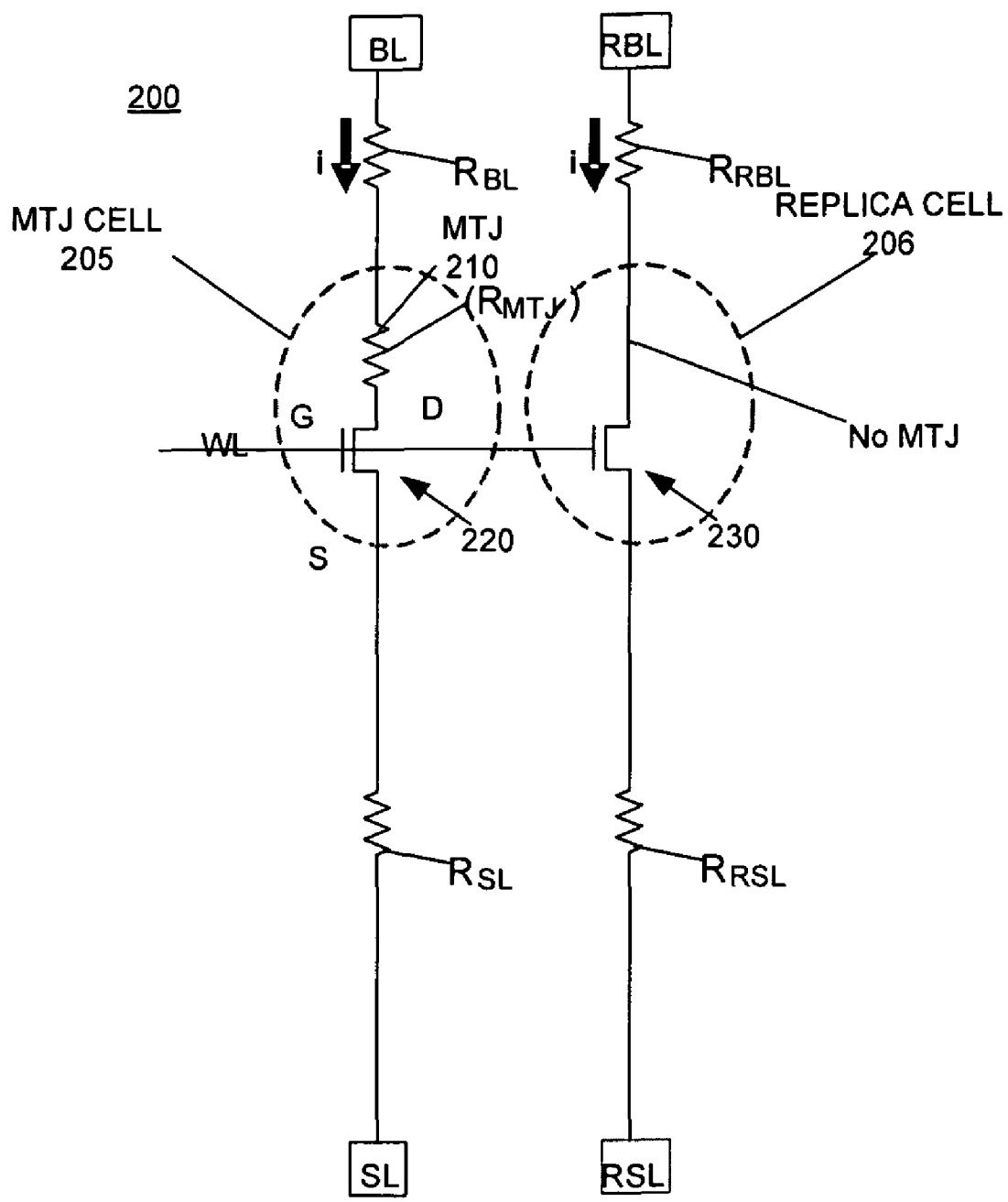
FIG. 2 is a representation of a magnetic tunnel junction cell and a replica cell in accordance with an embodiment of the disclosure.

FIG. 2 is a representation of a current mirror circuit 200 for evaluating a magnetic tunnel junction (MTJ) cell 205 using a replica cell 206 in accordance with an embodiment of the disclosure. An MTJ cell 205 includes an MTJ 210 and a transistor 220 having drain D, source S and gate G connections adapted to permit current to flow through the cell 205, depending on the signal applied to the gate. The MTJ 210 may be represented by a resistor $R_{MTJ}$, because this is the parameter of interest.

The MTJ 210, is coupled on one side to the drain D of the transistor 220, and a bit line BL on the other. A source S of the transistor 220 is coupled to a source line SL. The bit line BL and the source line SL may both be characterized by parasitic resistances $R_{BL}$ and $R_{SL}$, respectively.

When an appropriate signal is applied via a word line WL to the gate G of the transistor 220, making the transistor 220 conductive, the transistor 220 may be characterized by a parasitic resistance $R_T$. The parasitic resistances $R_{BL}+R_{SL}+R_T$ may on the order of 50% of the total resistance being measured.

A replica cell 206 includes a replica transistor and no MTJ. The replica transistor 230 is substantially the same as the MTJ cell transistor 220. In one embodiment, the transistors 220 and 230 are identical. Both the MTJ cell transistor 220 and the replica transistor 230 may be controlled in parallel by the same word line WL to become conductive simultaneously. The replica cell parasitic resistances $R_{RBL}+R_{RSL}+R_T$ remain, but the MTJ resistance $R_{MTJ}$ is absent in the replica cell 206. In an embodiment, the parasitic resistances in the circuit including the MTJ 210 are substantially identical to the parasitic resistances in the circuit including the replica cell 206, but are otherwise substantially the same within some range of variance.

A current mirror method of measuring the resistance value of the MTJ 210 is now described. The source line SL and the replica source RSL may be grounded together, or tied to the same voltage potential. Assume the MTJ 210 has been previously written to a known state (e.g., low, or 0). A bit line voltage $V_{BL}$ having a value sufficient to "read" the MTJ state, but not sufficient to disturb the state, is applied to the bit line BL. The word line WL is coupled to the gates G of both the MTJ cell transistor 220 and the replica transistor 230, which are both turned on together by an applied write signal. The resulting current $i_{BL}$ in the MTJ cell 205 is the bit line voltage $V_{BL}$ divided by the total resistance $R_{BL}+R_{SL}+R_T+R_{MTJ}$. In the replica cell circuit, a variable replica bit line voltage $V_{RBL}$ is applied to the replica bit line RBL. $V_{RBL}$ may be varied until the resulting current in the replica circuit is the same as in the MTJ cell circuit. At this current value, the difference in voltages, $V_{BL}-V_{RBL}$, corresponds to the voltage drop that occurs only across the MTJ 210, assuming that the parasitic resistances in both the MTJ cell 205 and the replica cell 206 are substantially the same, or identical. Because the currents are the same in both the MTJ cell circuit and the replica cell circuit, i.e., the replica cell circuit current is set to equal $i_{BL}$, the MTJ resistance $R_{MTJ}$ is determined by the relationship $R_{MTJ}=(V_{BL}-V_{RBL})/i_{BL}$. Therefore, the resistance of the MTJ 210 is determined by a common mode rejection of the parasitic resistances.

The measurement may be repeated after the MTJ 210 is written to the opposite state (i.e., anti-parallel, or "1"). One value of $R_{MTJ}$ is obtained for each state, where $R_{MTJ}$ may be expected to be higher for the anti-parallel state 1 and lower for the parallel state 0. An intermediate reference resistance $R_{ref}$ may be chosen based on the measured low and high state values of $R_{MTJ}$. A logical state 0 or 1 may be generated respectively by output circuitry (not shown) depending on the relative value of the measured $R_{MTJ}$ when compared to $R_{ref}$.

Because any memory (including MRAM and STT-MRAM) may be composed of a large number of memory cells, a single value of $R_{ref}$ applicable to all MTJ cells 205 would be beneficial, but may not be practical due to process, voltage, and temperature (PVT) variations across the MRAM chip. Additionally, voltage level variations may occur, and operating or testing temperature conditions may vary the results. Such PVT variations affect the measured values of MTJs 210 across a chip containing large numbers of MTJ cells 205. Therefore, the replica cell may be reproduced in several local regions of the chip, and current mirror measurements of the MTJ cells 205 are performed within the local region. An architecture is disclosed below for accessing each MTJ cell 205 in a region with replica cells 206 co-located in proximity with the MTJ cells 205 on a regional basis. The replica circuitry is based on the circuits shown in FIG. 2. The architecture seeks to achieve a balance between reducing consumption of an undesirable amount of chip space used by replica cells and limiting power needed for testing due to parasitic resistances. In addition, because PVT variations, even between one location and another on a chip, in the resistance values of both nano-scale devices and the parasitic components can be expected, a statistical approach may be used in combination with the architecture of the chip design in order to determine a suitable value of $R_{ref}$.

Figure 3:
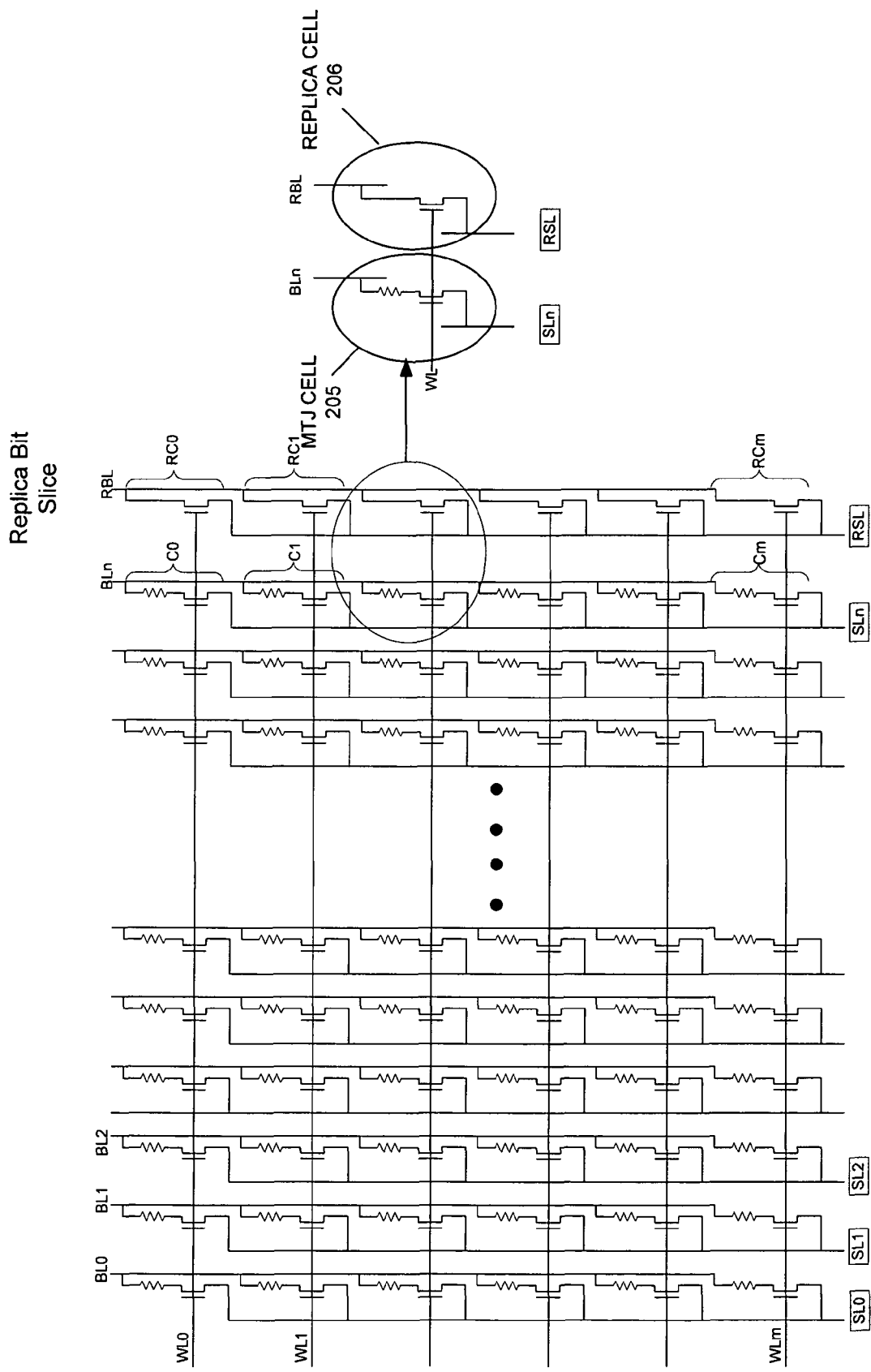
FIG. 3 is a representation of a bank having multiple MTJ bit slices of MTJ memory bit cells and a replica bit slice in accordance with an embodiment of the disclosure.

In one embodiment, FIG. 3 shows n+1 memory bit slices to be tested by one replica bit slice, where the memory bit slices are shown as vertical columns, and each bit slice is coupled to one of n+1 bit lines BL0-BLn. For example, 32 bit slices may be tested by one replica bit slice. Each bit slice contains m+1 MTJ cells C0-Cm, arranged vertically in each bit slice. Thus, the size of this memory is (n+1)×(m+1). An additional replica bit slice is arranged as a column parallel to the memory bit slices, and contains (m+1) replica cells RC0-RCm to mirror a corresponding number of MTJ cells C0-Cm in any memory bit slice identified by one of the bit lines BL0-BLn. As described above, each MTJ cell C0-Cm includes an MTJ 210 (represented as a resistor $R_{MTJ}$) and a transistor 220 Each replica cell RC0-RCm includes a transistor 230 but no MTJ. As shown in FIG. 3, all transistors 220, 230 in a single horizontal row (in both the memory bit slices and the replica bit slice) share a common word line WLo-WLm.

In any single memory bit slice, the bit lines connected to each MTJ cell C0-Cm are coupled in parallel to a single slice bit line from among the bit lines $BL_0$-$BL_n$. In the replica bit slice, all the transistors 230 are coupled (e.g., at the drains D) in parallel to a single replica bit line RBL. Similarly, all sources S of the transistor 220 in a single memory bit slice are coupled in parallel to a single slice source line from among the source lines $SL_0$-$SL_n$. In the replica bit slice, all the transistors 230 are coupled (e.g., at the sources S) in parallel to a single replica source line RSL. The parasitic resistances of the bit lines $BL_0$-$BL_n$, RBL, and source lines $SL_0$-$SL_n$, and RSL, are not shown, but are understood to exist.

The MTJ cells 205 in all bit slices and the replica cell 206 having the same vertical address (e.g., C1, RC1, as shown in FIG. 3), have their transistor gates G connected in parallel to a single word line from among $WL_0$-$WL_m$, e.g., $WL_1$. That is, there are (m+1) word lines corresponding to the (m+1) cells in each slice.

It can be seen from FIG. 3 that if the array of memory cells becomes large, i.e., the number of memory bit slices or the number of memory cells for each bit slice becomes large, the parasitic resistances associated with long bit lines, source lines and word lines can become large relative to the values of the MTJ resistance $R_{MTJ}$. Therefore, the size of an array of memory cells, may be chosen accordingly, and a replica bit slice is provided for each array. For example, a bank may include 32 memory bit slices each containing 512 memory cells and one replica bit slice containing 512 replica cells. A benefit of this configuration is that any MTJ cell 205 being tested may be only a few microns or tens of microns from a corresponding replica cell 206. PVT conditions may be reasonably assumed to be substantially uniform over such distances, and the parasitic resistances of the bit, source and word lines can be held within a selected statistical range. That is, the parasitic resistances may be substantially uniform within an array of the selected size, improving the accuracy of the measurement of the MTJ resistances.

Figure 4:
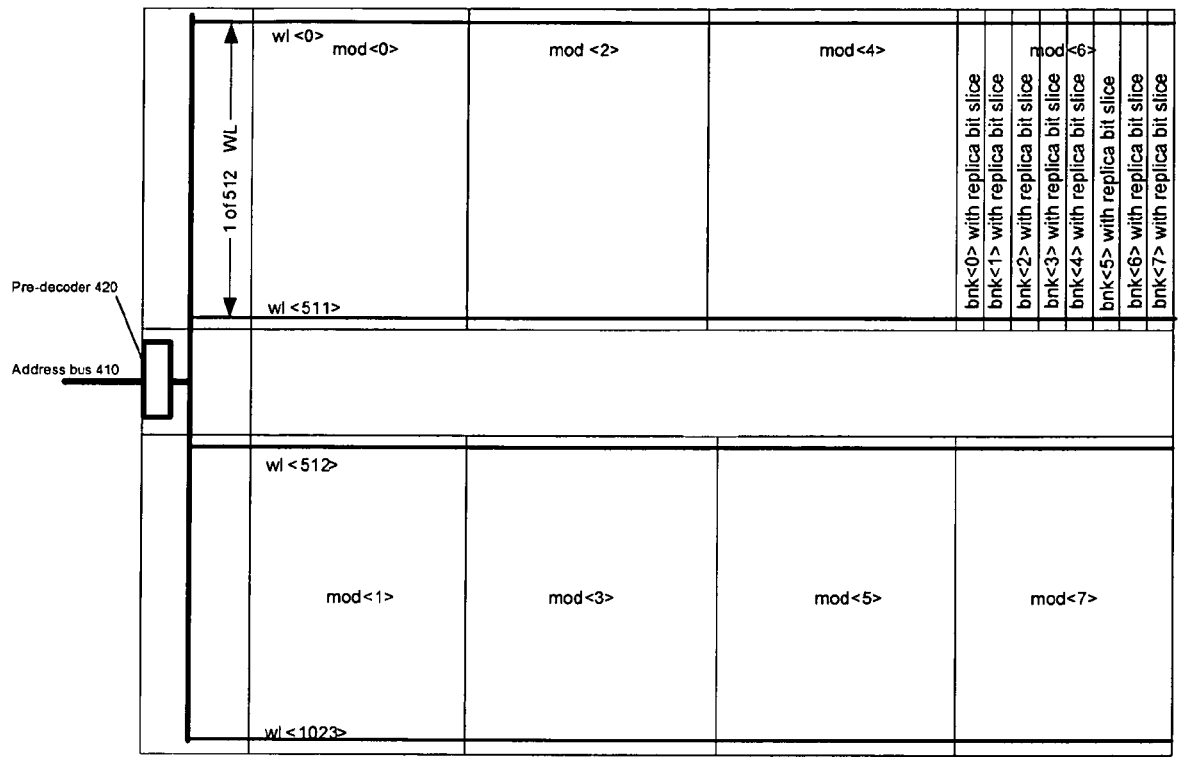
FIG. 4 is a representation of an architecture for a 1 Mb MRAM chip with in situ MTJ resistance measurement in accordance with an embodiment of the disclosure.

Larger memory arrays may be created by ganging multiple banks as described above. For example, FIG. 4 shows an embodiment for a 1 Mb MRAM chip with in situ MJT resistance measurement in accordance with an embodiment of the disclosure. The MRAM chip includes multiple banks arranged in multiple modules connected to an address bus 410 and a pre-decoder 420.

Furthermore, in an embodiment, eight such banks (bnk<0>-bnk<7>) may be organized into a module (mod<0>-mod<7>). The modules would then have 8×32×512=131,072 memory cells. Eight such modules (mod<0>-mod<7>) may be organized on a chip to include 1,048,576 ("1 MB") memory cells 205. Each of the modules may have a module address. As shown in FIG. 4, the modules are arranged in two rows of four modules each, to facilitate addressing of modules, banks, and bit slices.

As shown in FIG. 4, a total of 1,024 word lines $WL_0$-$WL_{1023}$ may be used to address the 512 bit cells in each bit slice: for example, 512 word lines $WL_0$-$WL_{511}$ for the upper row of modules, and 512 word lines $WL_{512}$-$WL_{1023}$ for the lower row of modules. In another embodiment, the upper and lower sets of word lines may be addressed in parallel pairs. For example, word lines $WL_0$ and $WL_{512}$ may be coupled in parallel so the word line signal is applied to both word lines substantially simultaneously. Thus, only 512 word line addresses may be needed. In this latter embodiment, for example, anytime a particular word line is addressed, the corresponding MTJ cell transistor 220 and replica transistor 230 are simultaneously turned on. That is, a single word line, when addressed, turns on the gates of 1,024 memory cell transistors and 64 replica cell transistors. However, specifying a single module/bank/bit slice address will result in a single memory cell-replica cell mirror current measurement. Addressing of memory cell-replica cell pairs in the memory 400 may be accomplished with an address bus 410, where an address signal received by the memory 400 is pre-decoded in a pre-decoder 420 to manage individual addressing of the word lines WL, bit lines BL, modules, banks, bit slices, etc.

Figure 5:
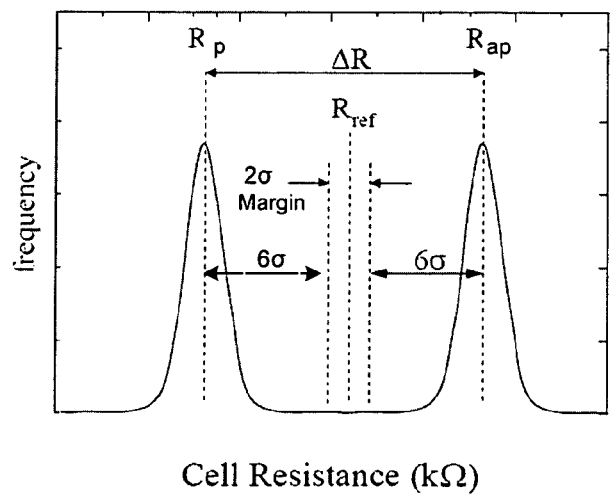
FIG. 5 is a histogram of measured parallel and anti-parallel MTJ resistance values for determining a reference resistance value in accordance with an embodiment of the disclosure.

FIG. 5 is a histogram of measured parallel (low) and anti-parallel (high) MTJ resistance $R_{low}$ and $R_{high}$ values, respectively, for determining a reference resistance value in accordance with an embodiment of the disclosure. A reference resistance $R_{ref}$ may be defined in order to determine whether a memory cell has an MTJ in a parallel magnetization 0-state with a resistance lower than $R_{ref}$ or in an anti-parallel magnetization 1-state with a resistance higher than $R_{ref}$. That is, comparing the measured resistance to the reference resistance determines the memory state of the MTJ cell during operation.

In an array of bit cells containing MTJs, the parallel resistance $R_p$ and anti-parallel resistance $R_{ap}$ each have a mean value and a distribution characterized by a standard deviation $\sigma$. The reference resistance $R_{ref}$ may be chosen to be substantially "centered" between $R_p$ and $R_{ap}$. In one embodiment, the separation of $R_{ref}$ from both $R_p$ and $R_{ap}$ is six times the respective $\sigma$s for the mean values of $R_p$ and $R_{ap}$. This may be referred to as a "$12\sigma$" separation between $R_p$ and $R_{ap}$. With an additional margin of separation of $1\sigma$ from each mean value, $R_p$ and $R_{ap}$ may be separated by "$14\sigma$" to improve the reliability of correctly sensing the state of the MTJ. An accurate measurement of $R_p$ and $R_{ap}$ respective means and distributions helps ensure proper sensing of data stored in the MTJ bit cell.

Figure 6:
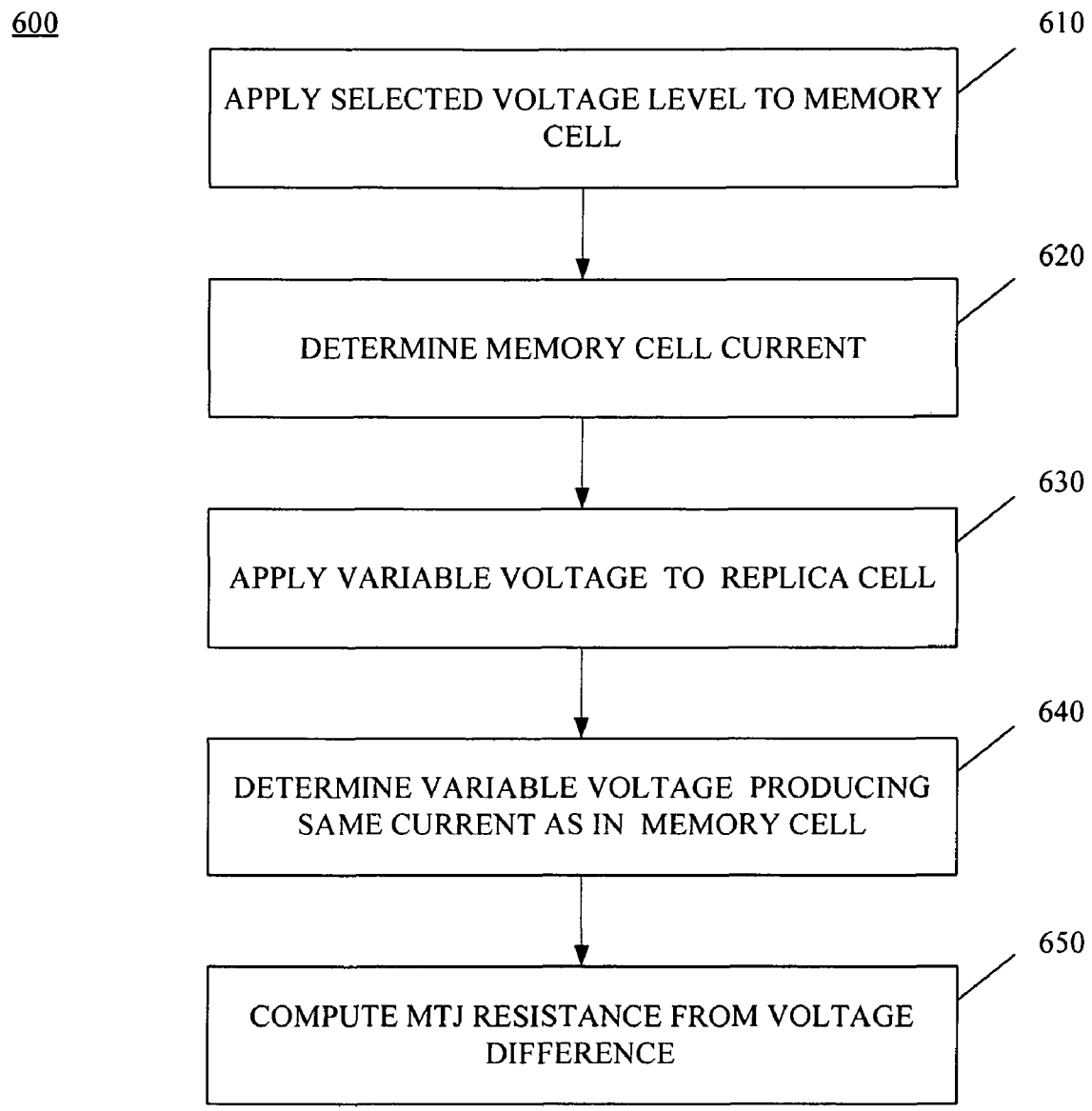
FIG. 6 is a flow diagram of a method for measuring MTJ resistance in accordance with an embodiment of the disclosure.

FIG. 6 is a flow diagram of a method 600 for measuring MTJ resistance in accordance with an embodiment of the disclosure. Assuming a memory MTJ cell 205 has an MTJ already written to a particular state, the objective is to measure the resistance of the MTJ 210. A selected voltage level $V_{BL}$ appropriate to read the MTJ 210 resistance (but not change it) is applied to a selected memory MTJ cell 205 (block 610). The applied voltage results in a current through the MTJ cell 205, which is measured (block 620). A variable voltage $V_{RBL}$ is applied to the corresponding replica cell 206 (block 630). A value of the variable voltage $V_{RBL}$ that produces the same current in the replica cell 206 as measured in the MTJ cell 205 is determined (block 640). The resistance $R_{MTJ}$ is then computed (block 650) as described above. The process flow of blocks 610-650 may be repeated as necessary for each bank of MTJ cells 205 to be measured.

It may be appreciated, therefore, that a system and method is disclosed for measuring MTJ resistance. This is especially valuable where nano scale structures are characterized in an integrated circuit environment where parasitic resistances are comparable to the MTJ resistance being measured.

Although specific circuitry has been set forth, it will be appreciated by those skilled in the art that not all of the disclosed circuitry is required to practice the embodiments of the disclosure. Moreover, certain well known circuits have not been described, to maintain focus on the disclosure. Similarly, although the description refers to states "0" and "1" in terms of parallel and anti-parallel MTJ polarization, one skilled in the art appreciates that the state values can be switched, with the remainder of the circuit adjusted accordingly, without affecting operation embodiments of the present disclosure.

Although the embodiments of the present disclosure and its advantages have been described in detail, it should be understood that various changes, substitutions and alterations can be made herein without departing from the spirit and scope of the disclosure as defined by the appended claims. For example, the number of bit slices tested by a single replica bit slice may be greater than or less than 32, and a memory bit slice and corresponding replica bit slice may include fewer or greater than 512 cells. Moreover, the scope of the present application is not intended to be limited to the particular embodiments of the process, machine, manufacture, composition of matter, means, methods and steps described in the specification. As one of ordinary skill in the art will readily appreciate from the embodiments of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of measuring resistance of a magnetic tunnel junction (MTJ) of a magnetic random access memory (MRAM) cell comprising:
   applying a voltage of a selected level to a memory cell comprising an MTJ in series with a memory cell transistor in a conducting state;
   determining an amount of current through the memory cell;
   applying a variable voltage to a replica cell not having an MTJ and comprising a replica cell transistor in a conducting state;
   determining a value of the variable voltage wherein an amount of current through the replica cell is substantially the same as the amount of current through the memory cell; and
   computing the MTJ resistance by taking the difference of the memory cell voltage and the determined variable replica cell voltage and dividing the result by the determined memory cell current.

2. The method of claim 1, further comprising:
   applying the selected voltage level to a memory cell bit line coupled to a first electrode of the MTJ; and
   applying a word line signal to a memory cell transistor gate to place the memory cell transistor in the conducting state.

3. The method of claim 2, further comprising:
   applying the variable voltage to a replica cell bit line coupled to a replica cell transistor drain; and
   applying the word line signal to a replica cell transistor gate to place the replica cell transistor in the conducting state.

4. The method of claim 3, further comprising:
   setting the memory bit line voltage to a level sufficient to generate a voltage drop across the MTJ, but not. sufficient to change the state of the MTJ.

5. The method of claim 1, further comprising computing the MTJ resistance of memory cells within a selected proximity to the replica cell.

6. The method of claim 1, wherein the MRAM is an spin-torque-transfer (STT) MRAM.

7. A circuit for measuring resistance of a magnetic tunnel junction (MTJ) of a memory cell in a magnetic random access memory (MRAM) comprising:
   a memory cell comprising an MTJ coupled in series with a memory cell transistor, the memory cell receiving a selected voltage level to produce a memory cell current; and a replica cell not having an MTJ and comprising a replica cell transistor, the replica cell receiving a variable voltage level to produce a replica cell current level that is substantially the same as a memory cell current level to enable calculation of the resistance of the MTJ.

8. The circuit of claim 7, wherein the memory cell further comprises:
a bit line to supply a bit line voltage to the MTJ;
a memory cell source line coupled to a cell transistor source to supply a cell source line voltage; and
a word line that provides a word line signal to a cell transistor gate to control the cell transistor.

9. The circuit of claim 8, wherein the replica cell further comprises:
a replica bit line to supply the variable voltage level to the replica cell;
a replica source line coupled to a source of the replica transistor to supply a replica source line voltage that is substantially the same as the cell source line voltage; and
a gate of the replica transistor that receives the word line signal to control the replica transistor.

10. The circuit of claim 9, wherein
the bit line voltage is at a level sufficient to generate a voltage drop across the MTJ, but not sufficient to change the state of the MTJ.

11. The circuit of claim 7, wherein the MRAM is an spin-torque-transfer (STT) MRAM.

12. The circuit of claim 7, the MRAM comprising:
a plurality of modules, each module comprising a plurality of banks, each bank comprising a plurality of memory bit slices having a selected number of memory cells and at least one replica bit slice.

13. The circuit of claim 12, further comprising:
a common bit line connected to each memory cell in each memory bit slice;
a common source line connected to each memory cell and replica cell in each memory bit slice and replica bit slice;
a replica bit line connected to each replica cell in each replica bit slice; and
a word line connected in each row to each of the corresponding memory cells and replica cells in the row.

14. The circuit of claim 1, wherein the MTJ is a spin-transfer-torque (STT) MTJ.

15. The method of claim 1, comprising:
dividing the MRAM into addressable segments;
comparing each MTJ cell in one of the addressable segments to a corresponding replica cell in an associated group of replica cells; and
determining a resistance of each MTJ cell on the basis of the comparing.

16. The method of claim 15, wherein the dividing the MRAM into addressable segments comprises:
dividing the MRAM into multiple addressable modules;
dividing the addressable modules into multiple banks addressable within each of the modules;
dividing the addressable banks into multiple memory bit slices addressable within each of the banks and at least one replica bit slice, the memory bit slices each containing a selected number of memory cells;
assigning a word line address to each memory cell; and
addressing each memory cell of the MRAM by specifying the module, bank, bit slice and word line address.

17. An array structure for magnetic tunnel junction (MTJ) magnetic random access memory (MRAM) comprising:
a plurality of modules;
a plurality of banks within each module;
a plurality of MTJ memory bit slices and a replica bit slice within each bank;
a plurality of MTJ memory cells within each MTJ memory bit slice, the memory cells each comprising an MTJ coupled in series with a memory cell transistor, each memory cell receiving a selected voltage level to produce a memory cell current; and
a plurality of replica cells within each replica bit slice, an amount of replica bit cells equaling a largest amount of MTJ memory cells in any MTJ bit slice of a same bank, the replica cells each not having an MJT and each comprising a replica cell transistor, the replica cells each receiving a variable voltage level to produce a replica cell current level that is substantially the same as a memory cell current level to enable calculation of the resistance of a corresponding MTJ.

18. The structure of claim 17, further comprising:
an address bus to receive address signals; and a pre-decoder to pre-decode the received address signals.

19. The structure of claim 17, further comprising a plurality of word lines, a first plurality of the word lines being associated with a first plurality of the modules, and a second plurality of the word lines being associated with a second plurality of the modules.

20. The structure of claim 17, wherein the MTJ memory cell is a spin-transfer-torque (STT) MTJ memory cell.

* * * * *